United States Patent
Ebina et al.

(10) Patent No.: US 6,995,420 B2
(45) Date of Patent: Feb. 7, 2006

(54) SEMICONDUCTOR DEVICE AND METHOD OF MANUFACTURING THE SAME

(75) Inventors: Akihiko Ebina, Fujimi-machi (JP); Susumu Inoue, Sakata (JP)

(73) Assignee: Seiko Epson Corporation, Tokyo (JP)

( * ) Notice: Subject to any disclaimer, the term of this patent is extended or adjusted under 35 U.S.C. 154(b) by 110 days.

(21) Appl. No.: 10/244,623

(22) Filed: Sep. 17, 2002

(65) Prior Publication Data

US 2003/0060011 A1    Mar. 27, 2003

(51) Int. Cl.
  *H01L 29/788* (2006.01)
(52) U.S. Cl. ............ 257/315; 257/316; 257/319; 257/324
(58) Field of Classification Search ........ 257/315–316, 257/324, 319, 345–347; 438/201, 211, 257
See application file for complete search history.

(56) References Cited

U.S. PATENT DOCUMENTS

| | | | |
|---|---|---|---|
| 5,408,115 | A | 4/1995 | Chang |
| 5,422,504 | A | 6/1995 | Chang et al. |
| 5,494,838 | A | 2/1996 | Chang et al. |
| 5,663,923 | A | 9/1997 | Baltar et al. |
| 5,969,383 | A | 10/1999 | Chang et al. |
| 6,177,318 | B1 | 1/2001 | Ogura et al. |
| 6,248,633 | B1 | 6/2001 | Ogura et al. |
| 6,255,166 | B1 | 7/2001 | Ogura et al. |
| 6,413,821 | B1 | 7/2002 | Ebina et al. |
| 6,518,124 | B1 | 2/2003 | Ebina et al. |
| 6,531,350 | B2 * | 3/2003 | Satoh et al. ............ 438/197 |
| 6,627,491 | B2 | 9/2003 | Ebina et al. |
| 6,709,922 | B2 | 3/2004 | Ebina et al. |
| 2002/0100929 | A1 | 8/2002 | Ebina et al. |
| 2003/0057505 | A1 | 3/2003 | Ebina et al. |
| 2003/0058705 | A1 | 3/2003 | Ebina et al. |
| 2003/0157767 | A1 | 8/2003 | Kasuya |
| 2003/0166320 | A1 | 9/2003 | Kasuya |
| 2003/0166321 | A1 | 9/2003 | Kasuya |
| 2003/0166322 | A1 | 9/2003 | Kasuya |
| 2003/0186505 | A1 | 10/2003 | Shibata |
| 2003/0190805 | A1 | 10/2003 | Inoue |
| 2003/0211691 | A1 | 11/2003 | Ueda |

(Continued)

FOREIGN PATENT DOCUMENTS

| | | |
|---|---|---|
| JP | 7-161851 A | 6/1995 |
| JP | A-11-8325 | 1/1999 |
| JP | 2978477 B1 | 9/1999 |
| JP | A-2001-148434 | 5/2001 |
| JP | 2001-156188 | 6/2001 |
| JP | A-2002-231830 | 8/2002 |

OTHER PUBLICATIONS

Hayashi, Yutaka et al., "Twin MONOS Cell with Dual Control Gates," 2000 IEEE VLSI Technology Digest.
Chang, Kuo-Tung et al., "A New SONOS Memory Using Source-Side Injection for Programming," IEEE Electron Device Letters, vol. 19, No. 7, Jul. 1998, pp. 253-255.

(Continued)

*Primary Examiner*—Hsien-Ming Lee
(74) *Attorney, Agent, or Firm*—Oliff & Berridge, PLC

(57) ABSTRACT

A semiconductor device of the present invention has memory cells. Each of the memory cells includes a word gate formed over a semiconductor substrate with a first gate insulating layer interposed therebetween, an impurity layer, and first and second control gates in a shape of sidewalls. Each of the first and second control gates has a rectangular or square cross-sectional shape.

15 Claims, 11 Drawing Sheets

U.S. PATENT DOCUMENTS

| | | |
|---|---|---|
| 2004/0072402 A1 | 4/2004 | Inoue |
| 2004/0072403 A1 | 4/2004 | Inoue |
| 2004/0077145 A1 | 4/2004 | Inoue |
| 2004/0097035 A1 | 5/2004 | Yamamukai |
| 2004/0129972 A1 | 7/2004 | Kasuya |
| 2004/0132247 A1 | 7/2004 | Kasuya |
| 2004/0135196 A1 | 7/2004 | Kasuya |

OTHER PUBLICATIONS

Chen, Wei-Ming et al., "A Novel Flash Memory Device with SPlit Gate Source Side Injection and ONO Charge Storage Stack (SPIN)," 1997 VLSI Technology Digest, pp. 63-64.

U.S. Appl. No. 10/690,025, filed Oct. 22, 2003, Kasuya.

* cited by examiner

SEMICONDUCTOR DEVICE AND METHOD OF MANUFACTURING THE SAME

BACKGROUND OF THE INVENTION

The present invention relates to a semiconductor device in which nonvolatile memory devices including two charge storage regions for one word gate are arranged in an array, and a method of manufacturing the same.

As one type of nonvolatile semiconductor memory device, a MONOS (Metal Oxide Nitride Oxide Semiconductor) or SONOS (Silicon Oxide Nitride Oxide Silicon) nonvolatile semiconductor memory device is known. In such a memory device; a gate insulating layer between a channel region and a control gate is formed of a stacked film including silicon oxide layers and a silicon nitride layer, and charges are trapped in the silicon nitride layer.

A device shown in FIG. 17 is known as a MONOS nonvolatile semiconductor memory device (Y. Hayashi, et al., 2000 Symposium on VLSI Technology Digest of Technical Papers, pp. 122–123).

In this MONOS memory cell 100, a word gate 14 is formed on a semiconductor substrate 10 with a first gate insulating layer 12 interposed therebetween. A first control gate 20 and a second control gate 30 in the shape of sidewalls are disposed on either side of the word gate 14. A second gate insulating layer 22 is present between the bottom of the first control gate 20 and the semiconductor substrate 10. An insulating layer 24 is present between the side of the first control gate 20 and the word gate 14. A second gate insulating layer 32 is present between the bottom of the second control gate 30 and the semiconductor substrate 10. An insulating layer 34 is present between the side of the second control gate 30 and the word gate 14. Impurity layers 16 and 18 which make up either a source region or a drain region are formed in the semiconductor substrate 10 between the control gate 20 and the control gate 30 which face each other in the adjacent memory cells.

As described above, one memory cell 100 includes two MONOS memory elements, one on each side of the word gate 14. These two MONOS memory elements are controlled separately. Therefore, one memory cell 100 is capable of storing two bits of information.

BRIEF SUMMARY OF THE INVENTION

The present invention may provide a semiconductor device including MONOS nonvolatile memory devices, each having two charge storage regions, and a method of manufacturing the same.

First Semiconductor Device

A first semiconductor device of the present invention includes a memory cell array a memory cell array in which nonvolatile memory devices are arranged in a matrix of a plurality of rows and columns, wherein each of the nonvolatile memory devices comprises:

a word gate which is formed over a semiconductor layer with a first gate insulating layer interposed therebetween;

an impurity layer which is formed in the semiconductor layer and forms at least one of a source region and a drain region; and first and second control gates in the shape of sidewalls which are formed along two opposing sides of the word gate, respectively, wherein the first control gate is disposed over the semiconductor layer with a second gate insulating layer interposed therebetween, a first side insulating layer being interposed between the first control gate and the word gate, wherein the second control gate is disposed over the semiconductor layer with a second gate insulating layer interposed therebetween, a first side insulating layer being interposed between the first control gate and the word gate, wherein each of the first and second control gates extends in a first direction, wherein the first and second control gates are disposed so as to be adjacent to each other in a second direction, which intersects the first direction, with the impurity layer interposed therebetween, and wherein each of the first and second control gates has one of rectangular and square cross-sectional shapes.

The cross-sectional shape of the first and second control gates used herein refers to a cross-sectional shape in the case where the first and second control gates are cut perpendicularly to the first direction.

Second Semiconductor Device

A second semiconductor device of the present invention includes a memory cell array in which nonvolatile memory devices are arranged in a matrix of a plurality of rows and columns, wherein each of the nonvolatile memory devices comprises:

a word gate which is formed over a semiconductor layer with a first gate insulating layer interposed therebetween;

an impurity layer which is formed in the semiconductor layer and forms at least one of a source region and a drain region; and first and second control gates in the shape of sidewalls which are formed along two opposing sides of the word gate, respectively, wherein the first control gate is disposed over the semiconductor layer with a second gate insulating layer interposed therebetween, a first side insulating layer being interposed between the first control gate and the word gate, wherein the second control gate is disposed over the semiconductor layer with a second gate insulating layer interposed therebetween, a first side insulating layer being interposed between the first control gate and the word gate, wherein each of the first and second control gates extends in a first direction, wherein the first and second control gates adjacent to each other in a second direction, which intersects the first direction, with the impurity layer interposed therebetween, are connected with a common contact section, wherein the common contact section includes a contact conductive layer, and wherein the contact conductive layer is continuous with the first and second control gates.

According to the second semiconductor device of the present invention, since the first and second control gates in the shape of sidewalls are connected with the common contact section, electrical connection with narrow control gates can be secured reliably.

In the second semiconductor device of the present invention, each of the first and second control gates may have one of rectangular and square cross-sectional shapes. A depression may be formed by the contact conductive layer. In this case, an interlayer dielectric may be further provided over the semiconductor layer, a contact hole may be formed on the depression through the interlayer dielectric, and the contact hole may be filled with a plug conductive layer.

The contact conductive layer may be formed of the same material as the first and second control gates.

The contact conductive layer may be disposed over the semiconductor layer with a contact insulating layer interposed therebetween, and the contact insulating layer may be formed of the same material as the second gate insulating layer.

A second side insulating layer may be disposed along the contact conductive layer. The second side insulating layer may be formed of the same material as the first side insulating layer.

The common contact section may be provided adjacent to an end of the impurity layer. A plurality of the common contact sections may be provided alternately on one ends and opposite ends of the impurity layers.

The first and second semiconductor devices of the present invention may have the following features.

(A) A third insulating layer may be formed on the first and second control gates.

(B) An upper end of the first side insulating layer may be located higher than the first and second control gates. This enables an embedding insulating layer which covers the control gates to be formed reliably. Specifically, the adjacent first and second control gates are covered with a single embedding insulating layer. The embedding insulating layer is formed between the two side insulating layers facing each other which are disposed in contact with the first and second control gates.

(C) Each of the second gate insulating layer and the first side insulating layer may be formed of a stacked film including a first silicon oxide layer, a silicon nitride layer, and a second silicon oxide layer.

Method of Manufacturing First Semiconductor Device

A method of manufacturing the first semiconductor device of the present invention is a method of manufacturing a semiconductor device including a memory cell array in which nonvolatile memory devices are arranged in a matrix of a plurality of rows and columns, the method comprising steps of:

forming a first insulating layer to be a first gate insulating layer over a semiconductor layer;

forming a first conductive layer over the first insulating layer;

forming a stopper layer over the first conductive layer;

forming a gate layer by patterning the first conductive layer and the stopper layer;

forming a second gate insulating layer at least over the semiconductor layer;

forming a first side insulating layer along two opposing sides of the gate layer;

forming a second conductive layer in a formation region of the memory cell array;

anisotropically etching the second conductive layer;

forming first and second control gates in a shape of sidewalls in the formation region of the memory cell array by polishing a second insulating layer and the second conductive layer by using a chemical mechanical polishing method so that the stopper layer is exposed, after forming the second insulating layer in the formation region of the memory cell array;

removing the stopper layer;

forming an impurity layer which forms at least one of a source region and a drain region in the semiconductor layer, and patterning the gate layer and a third conductive layer after forming the third conductive layer in the formation region of the memory cell array, then forming a word gate and a word line connected with the word gate.

Method of Manufacturing Second Semiconductor Device

A method of manufacturing the second semiconductor device of the present invention is a method of manufacturing a semiconductor device including a memory cell array in which nonvolatile memory devices are arranged in a matrix of a plurality of rows and columns, the method comprising steps of:

forming a first insulating layer to be a first gate insulating layer over a semiconductor layer;

forming a first conductive layer over the first insulating layer;

forming a stopper layer over the first conductive layer;

forming a gate layer by patterning the first conductive layer and the stopper layer;

forming a second gate insulating layer at least over the semiconductor layer;

forming a first side insulating layer along two opposing sides of the gate layer;

forming a second conductive layer in a formation region of the memory cell array;

anisotropically etching the second conductive layer after forming a mask on the second conductive layer in a region corresponding to a formation region of a common contact section;

forming first and second control gates in a shape of sidewalls in the formation region of the memory cell array by polishing a second insulating layer and the second conductive layer by using a chemical mechanical polishing method so that the stopper layer is exposed, after forming the second insulating layer in the formation region of the memory cell array, and then forming a contact conductive layer in the formation region of the common contact section;

removing the stopper layer;

forming an impurity layer which forms at least one of a source region and a drain region in the semiconductor layer, and patterning the gate layer and a third conductive layer after forming the third conductive layer in the formation region of the memory cell array, then forming a word gate and a word line connected with the word gate.

According to the method of manufacturing the second semiconductor device of the present invention, since the common contact section can be formed together with the first and second control gates in the shape of sidewalls without increasing the number of steps, reliable electrical connection can be secured through the common contact section.

The method of manufacturing the second semiconductor device of the present invention may further comprise a step of forming a third insulating layer on the contact conductive layer.

The method of manufacturing the second semiconductor device of the present invention may further comprise steps of:

forming an interlayer dielectric in the formation region of the memory cell array and forming a contact hole on the contact conductive layer through the interlayer dielectric; and filling the contact hole with a plug conductive layer.

In this case, the contact conductive layer may be formed in the same formation step as the first and second control gates.

The method may further comprise steps of forming a contact insulating layer over the semiconductor layer and forming a second side insulating layer along the contact conductive layer, in the formation region of the common contact section, wherein the contact insulating layer may be formed in the same step as the step of forming the second gate insulating layer, and wherein the second side insulating layer may be formed in the same step as the step of forming the first side insulating layer.

The common contact section may be provided adjacent to an end of the impurity layer. A plurality of the impurity layers may be arranged, and a plurality of the common contact sections may be provided alternately on one ends and opposite ends of the impurity layers.

The methods of manufacturing the first and second semiconductor devices of the present invention may have the following features.

(a) The method may further comprise a step of forming a third insulating layer on the first and second control gates.

(b) The second gate insulating layer and the first side insulating layer may be formed in the same formation step, and each of the second gate insulating layer and the first side insulating layer may be formed of a stacked film including a first silicon oxide layer, a silicon nitride layer, and a second silicon oxide layer.

(c) The first side insulating layer may be formed so that an upper end of the first side insulating layer is located higher than the first and second control gates.

(d) In the step of polishing the second insulating layer by using the chemical mechanical polishing method (hereinafter may be called "CMP method"), the first and second control gates adjacent to each other may be formed so as to be covered with an embedding insulating layer.

DETAILED DESCRIPTION OF THE EMBODIMENT

Figure 1:
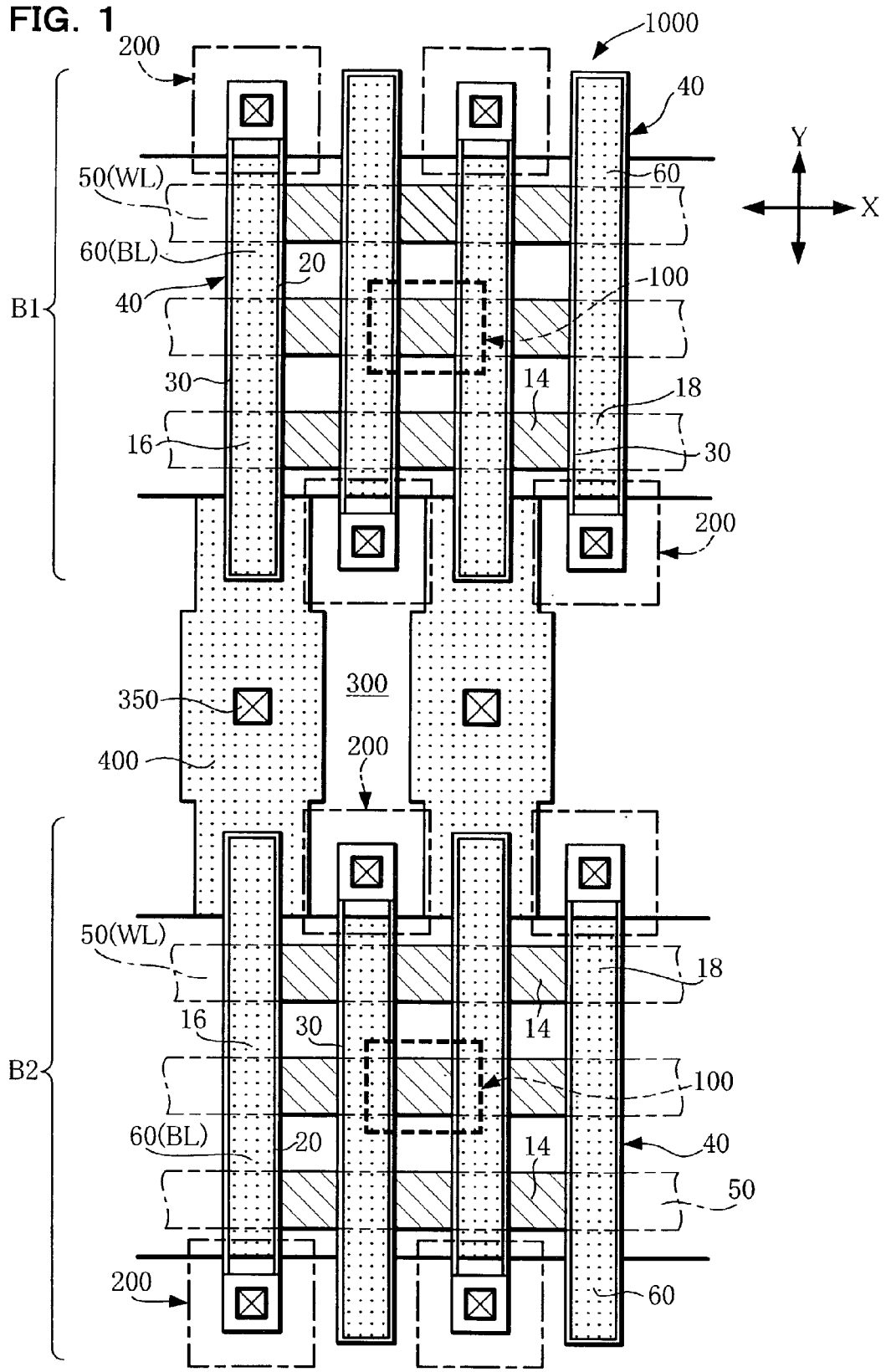
FIG. 1 is a plan view schematically showing a layout of a semiconductor device according to an embodiment of the present invention.
Figure 2:
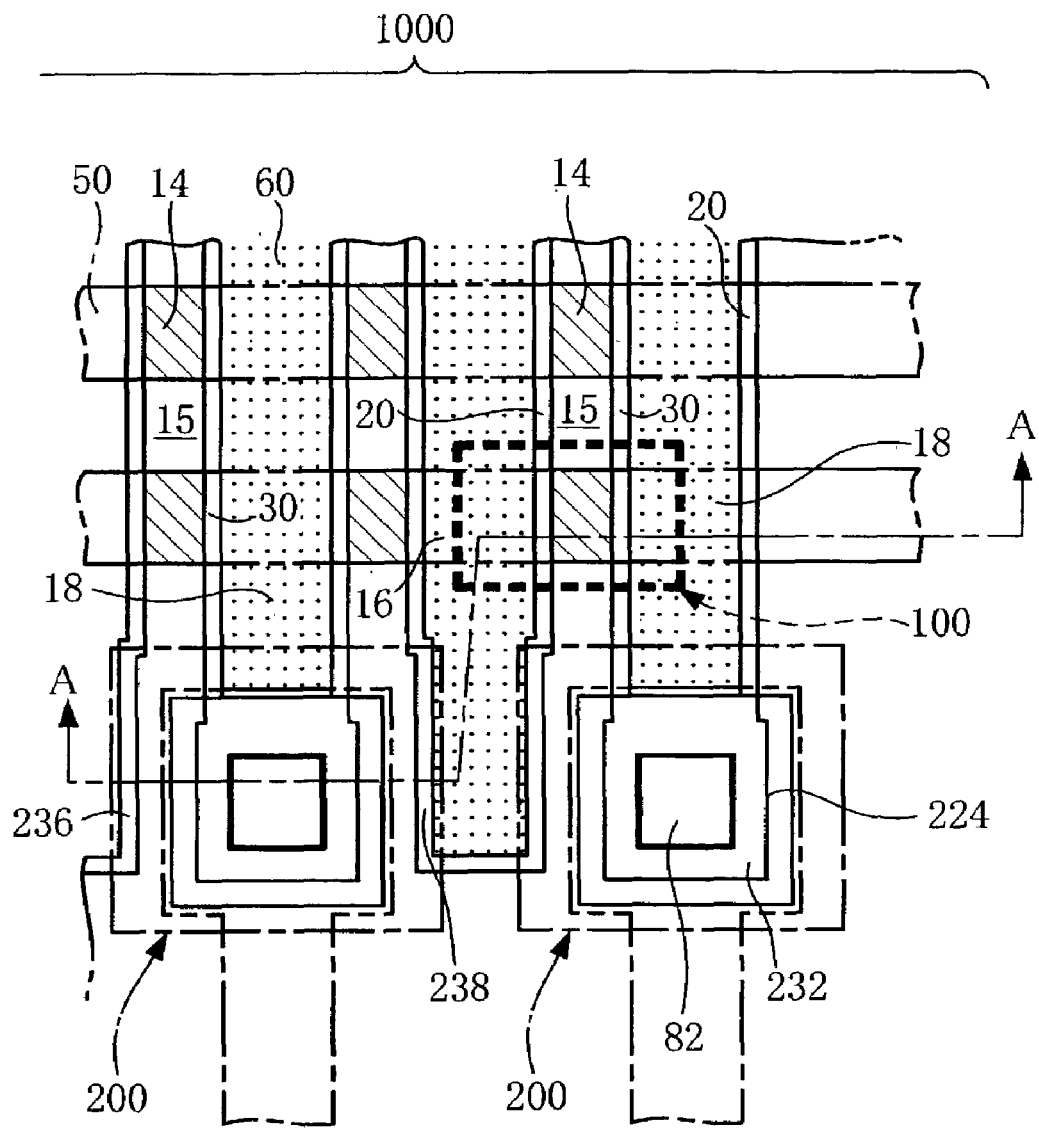
FIG. 2 is a plan view schematically showing the feature of the semiconductor device according to the embodiment of the present invention.
Figure 3:
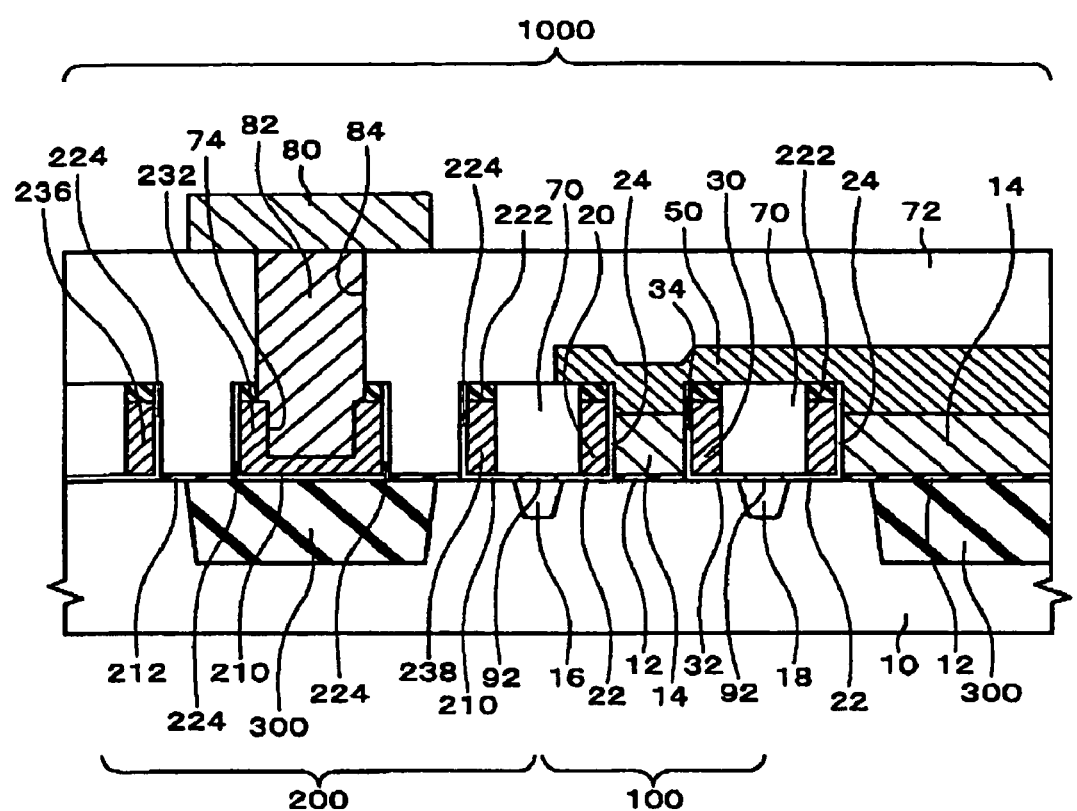
FIG. 3 is a cross-sectional view schematically showing the section along the line A—A shown in FIG. 2.

FIG. 1 is a plan view schematically showing a layout of a semiconductor device according to an embodiment of the present invention. FIG. 2 is a plan view showing part of the semiconductor device according to the present embodiment. FIG. 3 is a cross-sectional view schematically showing the section along the line A—A shown in FIG. 2.

The semiconductor device according to the present embodiment includes a memory cell array 1000 in which MONOS nonvolatile memory devices (hereinafter called "memory cells") 100 are arranged in a plurality of rows and columns in the shape of a lattice. The memory cell array 1000 is divided into a plurality of blocks.

Device Structure

The layout of the semiconductor device of the present embodiment is described below with reference to FIG. 1.

FIG. 1 shows a first block B1 and a second block B2 adjacent thereto. An element isolation region 300 is formed in part of a region between the first block B1 and the second block B2. A plurality of word lines (WL) 50 extending in the X direction (row direction) and a plurality of bit lines (BL) 60 extending in the Y direction (column direction) are provided in each of the blocks B1 and B2. One word line 50 is connected with a plurality of word gates 14 arranged in the X direction. The bit lines 60 are formed by impurity layers 16 and 18.

Conductive layers 40 which make up first and second control gates 20 and 30 are formed to enclose each of the impurity layers 16 and 18. Specifically, each of the first and second control gates 20 and 30 extends in the Y direction. One of the end sections of a pair of first and second control gates 20 and 30 is connected by the conductive layer extending in the X direction.

The other end sections of the pair of first and second control gates 20 and 30 are connected with one common contact section 200. Therefore, each of the first and second control gates 20 and 30 has a function as the control gate of the memory cells and a function as an interconnect which connects the control gates arranged in the Y direction.

The common contact sections 200 are provided adjacent to the end sections of the impurity layers 16 and 18, as shown in FIG. 1. The common contact sections are alternately provided to one end section and the opposite end section of the impurity layers 16 and 18.

A single memory cell 100 includes one word gate 14, the first and second control gates 20 and 30 which are formed on either side of the word gate 14, and the impurity layers 16 and 18 formed in a semiconductor substrate outside the control gates 20 and 30. The impurity layers 16 and 18 are shared by the adjacent memory cells 100.

The impurity layer 16 formed in the block B1 and the impurity layer 16 formed in the block B2 adjacent in the Y direction are electrically connected by a contact impurity layer 400 formed in the semiconductor substrate. The contact impurity layer 400 is formed on the side of the impurity layer 16 opposite to the side on which the common contact section 200 of the control gates is formed.

A contact 350 is formed on the contact impurity layer 400. The bit line 60 formed of the impurity layer 16 is electrically connected with an upper interconnect layer by the contact 350.

The two impurity layers 18 adjacent in the Y direction are electrically connected with each other by the contact impurity layer (not shown) on the side on which the common contact section 200 is not disposed.

As shown in FIG. 1, the planar layout of a plurality of common contact sections 200 in one block is in a zigzag arrangement. Similarly, the planar layout of a plurality of contact impurity layers 400 in one block is in a zigzag arrangement.

The planar structure and the cross-sectional structure of the semiconductor device are described below with reference to FIGS. 2 and 3.

The memory cell 100 includes the word gate 14 which is formed on a semiconductor substrate 10 with a first gate insulating layer 12 interposed therebetween, the impurity layers 16 and 18 which are formed in the semiconductor substrate 10 and make up either a source region or a drain region, and the first and second control gates 20 and 30 in the shape of sidewalls which are formed along either side of the word gate 14. Silicide layers 92 are formed on the impurity layers 16 and 18.

The cross-sectional shape of each of the first and second control gates 20 and 30 is rectangular, as shown in FIG. 3. A third insulating layer 222 is formed on the first and second control gates 20 and 30. The third insulating layer 222 is formed of a silicon oxide layer, for example.

The first control gate 20 is disposed on the semiconductor substrate 10 with a second gate insulating layer 22 interposed therebetween and disposed on one side of the word gate 14 with a first side insulating layer 24 interposed therebetween. The second control gate 30 is disposed on the semiconductor substrate 10 with a second gate insulating layer 32 interposed therebetween and disposed on the other side of the word gate 14 with a first side insulating layer 34 interposed therebetween.

The second gate insulating layers 22 and 32 and the first side insulating layers 24 and 34 are ONO films. In more detail, the second gate insulating layers 22 and 32 and the first side insulating layers 24 and 34 are stacked films including a first silicon oxide layer (bottom silicon oxide layer), a silicon nitride layer, and a second silicon oxide layer (top silicon oxide layer).

The first silicon oxide layers of the second gate insulating layers 22 and 32 function as a potential barrier between a channel region and a charge storage region.

The silicon nitride layers of the second gate insulating layers 22 and 32 function as a charge storage region in which carriers (electrons, for example) are trapped.

The second silicon oxide layers of the second gate insulating layers 22 and 32 form a potential barrier between the control gate and the charge storage region.

The first side insulating layers 24 and 34 electrically isolate the word gate 14 respectively from the first and second control gates 20 and 30. The upper ends of the first side insulating layers 24 and 34 are located at a position higher than the upper ends of the first and second control gates 20 and 30 with respect to the semiconductor substrate 10 in order to prevent occurrence of short circuits between the word gate 14 and the first and second control gates 20 and 30.

In the present embodiment, the first side insulating layers 24 and 34 and the second gate insulating layers 22 and 32 are formed in the same formation step and have the same layer structure. The first side insulating layers 24 and 34 are formed so that the upper ends of the first side insulating layers 24 and 34 are located at a position higher than the first and second control gates 20 and 30 with respect to the semiconductor substrate 10. An embedding insulating layer 70 is formed between the first control gate 20 and the second control gate 30 facing each other in the adjacent memory cells 100. In the present embodiment, the first and second control gates 20 and 30 are covered with the embedding insulating layer 70. The embedding insulating layer 70 covers the first and second control gates 20 and 30 so that at least the first and second control gates 20 and 30 are not exposed. In more detail, the upper side of the embedding insulating layer 70 is located at a position higher than the upper ends of the first side insulating layers 24 and 34 with respect to the semiconductor substrate 10. The first and second control gates 20 and 30 can be electrically isolated from the word gate 14 and the word line 50 more reliably by forming the embedding insulating layer 70 in this manner.

Conductive layers for supplying a specific potential to the first and second control gates 20 and 30 are formed in the common contact section 200. The common contact section 200 includes a contact conductive layer 232.

The contact conductive layer 232 is formed along the contact insulating layer 210 and the second side insulating layer 224. The contact conductive layer 232 is formed in the same formation step as the first and second control gates 20 and 30 so as to be continuous with the first and second control gates 20 and 30. Therefore, the contact conductive layer 232 and the first and second control gates 20 and 30 are formed of the same material.

The contact conductive layer 232 is disposed on the semiconductor substrate 10 with the contact insulating layer 210 interposed therebetween. A depression 74 is formed by the contact conductive layer 232. The depression 74 is filled with a plug conductive layer 82.

The contact insulating layer 210 and the second side insulating layer 224 which make up the common contact section 200 are formed in the same step as the second gate insulating layers 22 and 32 and the first side insulating layers 24 and 34 which make up the memory cell 100 and have the same layer structure. Specifically, the contact insulating layer 210 and the second side insulating layer 224 are formed of stacked films including the first silicon oxide layer, the silicon nitride layer, and the second silicon oxide layer in the same manner as the second gate insulating layers 22 and 32 and the first side insulating layers 24 and 34. The insulating layer 212 which makes up the common contact section 200 is formed in the same step as the first gate insulating layer 12 which makes up the memory cell 100 and have the same layer structure.

As shown in FIG. 3, the common contact section 200 further includes conductive layers 236 and 238 in the shape of sidewalls. The conductive layers 236 and 238 are disposed to sandwich the contact conductive layer 232. The third insulating layer 222 is formed on the conductive layers 236 and 238. The cross-sectional shape of each of the conductive layers 236 and 238 is rectangular in the same manner as the first and second control gates 20 and 30.

The conductive layer 236 is continuous with the first control gate 20. The first control gate 20 connected with the conductive layer 236 is adjacent to the second control gate 30 continuous with the conductive layer 232. The conductive layer 238 is continuous with the second control gate 30. The second control gate 30 connected with the conductive layer 238 is adjacent to the first control gate 20 continuous with the conductive layer 232.

Each of the conductive layers 236 and 238 is disposed along the contact insulating layer 210 and the second side insulating layer 224. The conductive layers 236 and 238 are formed in the same formation step as the first and second control gates 20 and 30 and the contact conductive layer 232 and formed of the same material as these layers.

An interlayer dielectric 72 is formed on the semiconductor substrate 10 on which the memory cells 100, the common contact sections 200, and the like are formed. A contact hole 84 which reaches the contact conductive layer 232 of the common contact section 200 is formed in the interlayer dielectric 72. The contact hole 84 is filled with the plug conductive layer 82 such as a tungsten plug or a copper plug. The plug conductive layer 82 is connected with an interconnect layer 80 which is formed on the interlayer dielectric 72.

According to the semiconductor device of the present embodiment, every pair of first and second control gates 20 and 30 in the shape of sidewalls is connected with the common contact section 200 in the memory cell array 1000. The common contact section 200 includes the contact conductive layer 232. The first and second control gates 20 and 30 are in the shape of sidewalls and generally have a width of less than 0.1 $\mu$m. Therefore, electrical connection between the control gates 20 and 30 and the common contact section 200 can be secured by providing the contact conductive layer 232. As a result, electrical contact with the control gates can be secured in the smallest area by using the common contact section 200.

According to the semiconductor device of the present embodiment, since the contact conductive layer 232 is directly connected with the plug conductive layer 82 in the common contact section 200, good electrical connection can be secured.

Method of Manufacturing Semiconductor Device

A method of manufacturing the semiconductor device according to the present embodiment is described below with reference to FIGS. 4 to 16. Each cross-sectional view corresponds to the section along the line A—A shown in FIG. 2. In FIGS. 4 to 16, sections the same as those shown in FIGS. 1 to 3 are indicated by the same symbols. Description of these sections given above is omitted.

Figure 4:
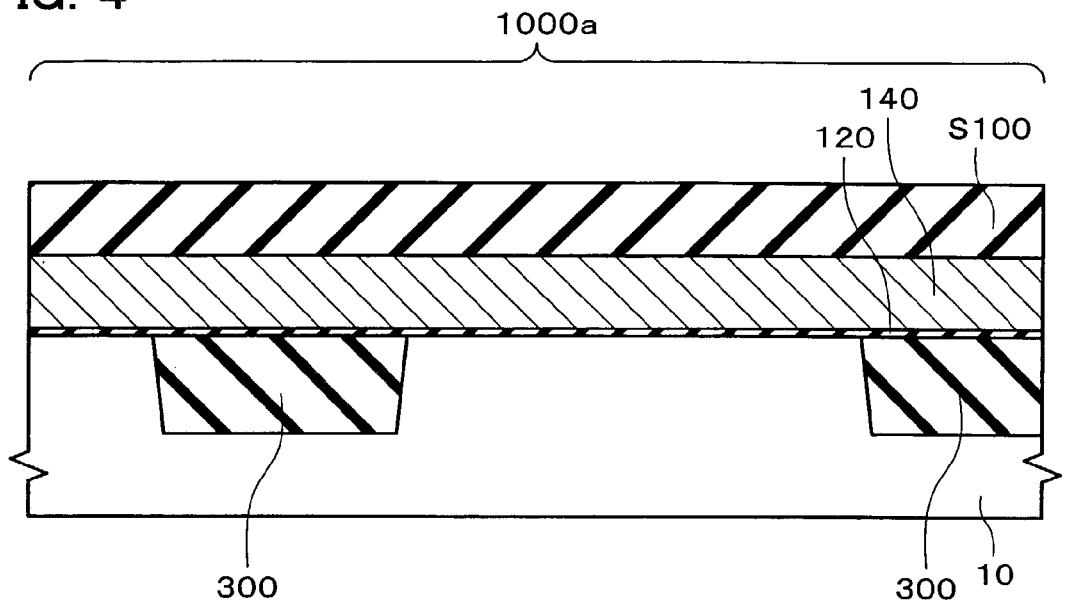
FIG. 4 is a cross-sectional view showing a step of a method of manufacturing the semiconductor device shown in FIGS. 1 to 3.
Figure 5:
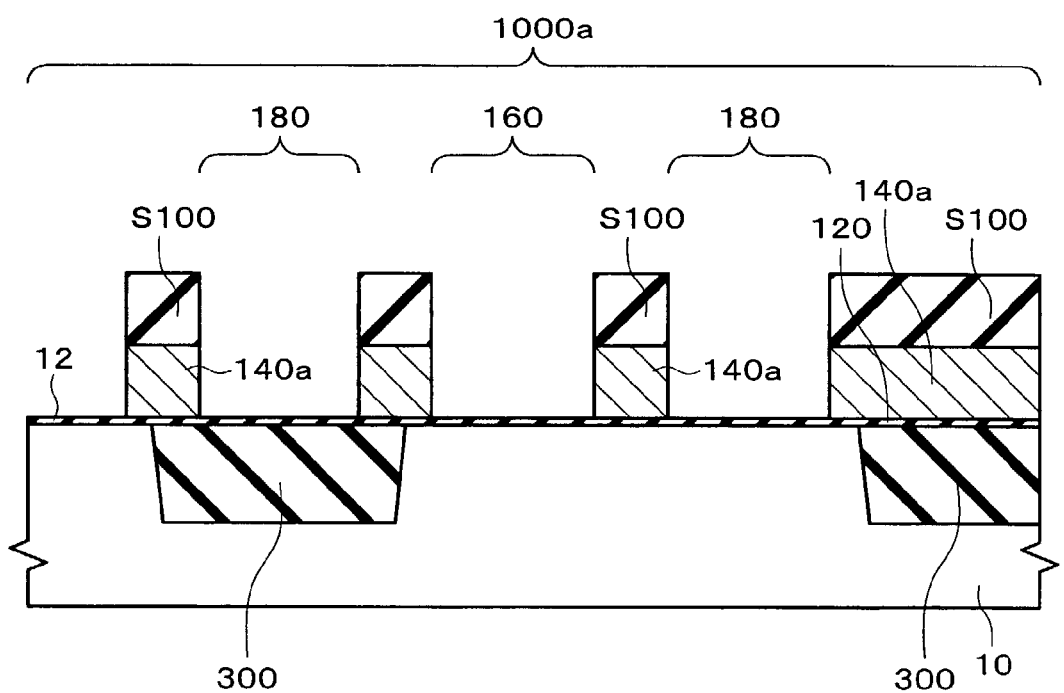
FIG. 5 is a cross-sectional view showing another step of the method of manufacturing the semiconductor device shown in FIGS. 1 to 3.

(1) As shown in FIG. 4, the element isolation region 300 is formed on the surface of the semiconductor substrate 10 in a region 1000a in which the memory cell array 1000 shown in FIG. 1 is formed (hereinafter called "memory cell array formation region") by using a trench isolation method.

The contact impurity layer 400 (see FIG. 1) is formed in the semiconductor substrate 10 by ion implantation.

A first insulating layer 120 which becomes the first gate insulating layer is formed on the surface of the semiconductor substrate 10. A first conductive layer 140 which becomes the word gate 14 is deposited on the first insulating layer 120. The first conductive layer 140 is formed of doped polysilicon. A stopper layer S100 used in a subsequent CMP step is formed on the first conductive layer 140. The stopper layer S100 is formed of a silicon nitride layer, for example.

Figure 6:
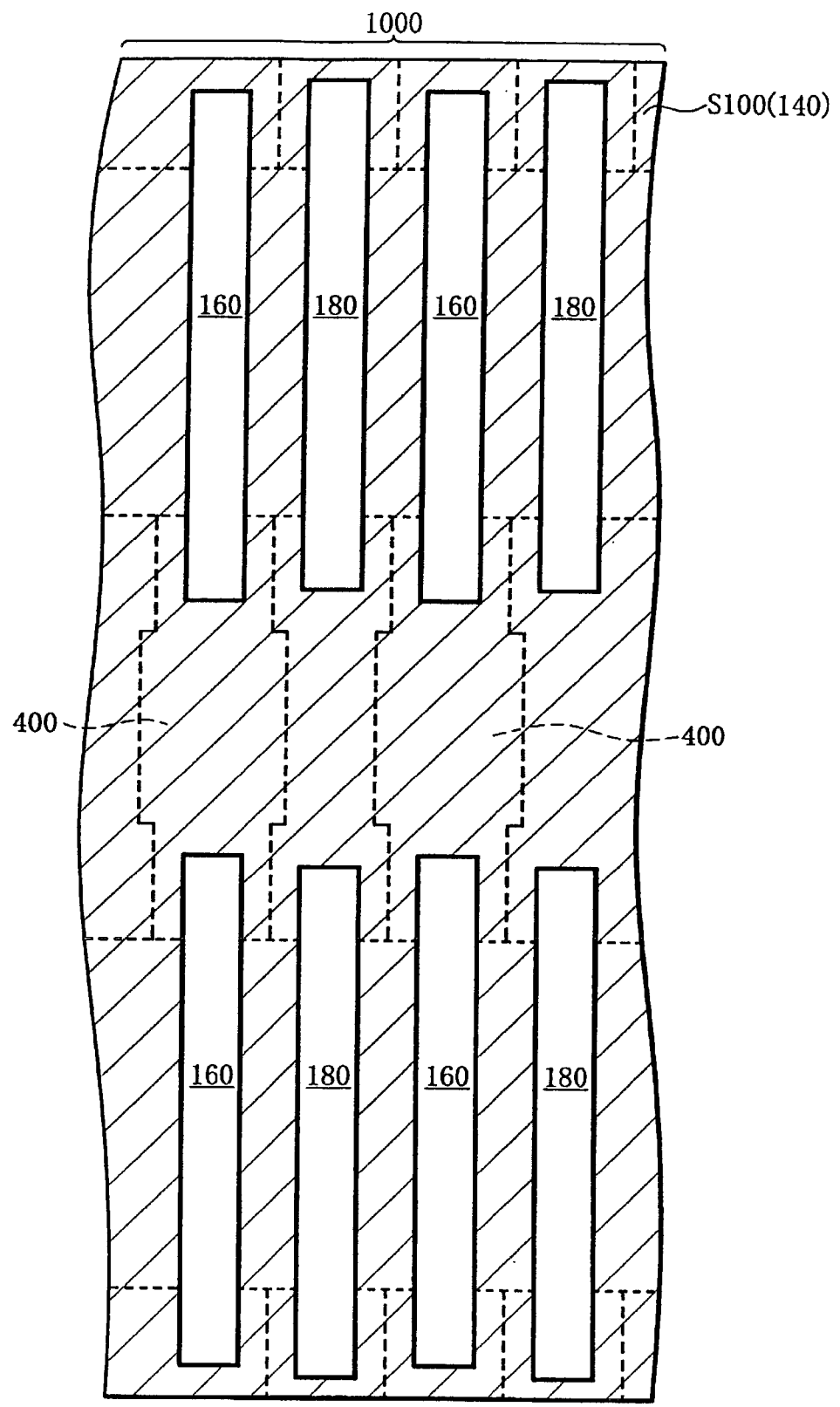
FIG. 6 is a plan view showing the step of the method of manufacturing the semiconductor device shown in FIG. 5.

(2) The first conductive layer 140 and the stopper layer S100 are patterned by using conventional lithography and etching. A gate layer 140a which becomes the word gate is formed by this step. In this patterning, a laminate consisting of the gate layer 140a and the stopper layer S100 is formed over the entire surface of the semiconductor substrate 10 in the memory cell array formation region 1000a. FIG. 6 is a plan view showing a state after patterning. Openings 160 and 180 are formed in a laminate consisting of the gate layer 140a and the stopper layer S100 in the memory region 1000 by this patterning. The openings 160 and 180 approximately correspond to regions in which the impurity layers 16 and 18 are formed by subsequent ion implantation. The first side insulating layers 24 and 34 and the first and second control gates 20 and 30 are formed along the sides of the openings 160 and 180 in a subsequent step.

Figure 7:
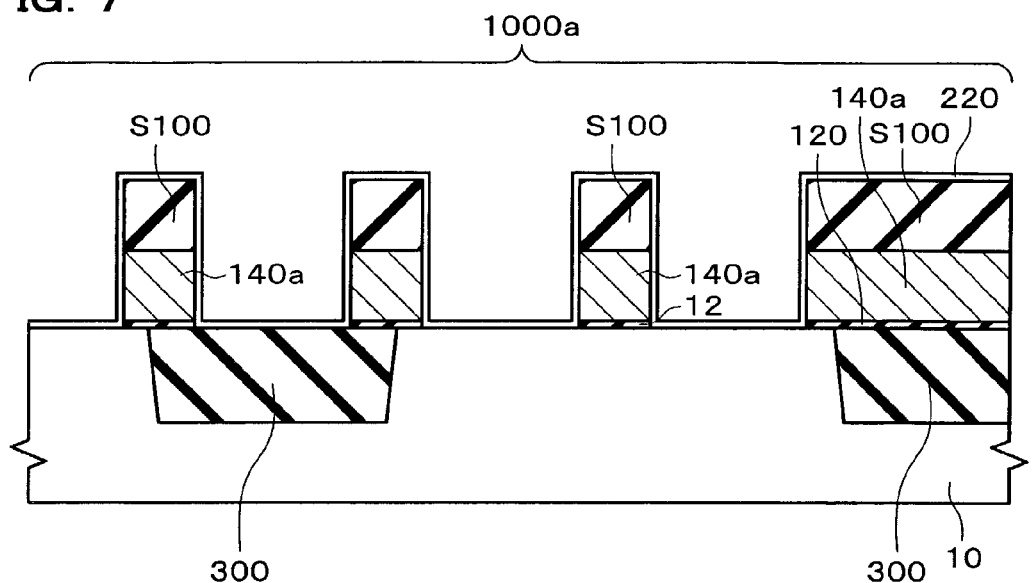
FIG. 7 is a cross-sectional view showing another step of the method of manufacturing the semiconductor device shown in FIGS. 1 to 3.

(3) As shown in FIG. 7, an ONO film 220 is formed over the entire surface of the semiconductor substrate 10. The ONO film 220 is formed by depositing the first silicon oxide layer, the silicon nitride layer, and the second silicon oxide layer in that order. The first silicon oxide layer may be deposited by using a thermal oxidation method, a CVD method, or the like. The silicon nitride layer may be deposited by using a CVD method or the like. The second silicon oxide layer may be deposited by using a CVD method such as a high temperature oxidation (HTO) method. After depositing these layers, it is preferable to densify each layer by annealing.

The ONO film 220 becomes the second gate insulating layer 22, the first side insulating layer 24, and the contact insulating layer 210 and the second side insulating layer 224 of the common contact section 200 (see FIG. 3) by subsequent patterning.

Figure 8:
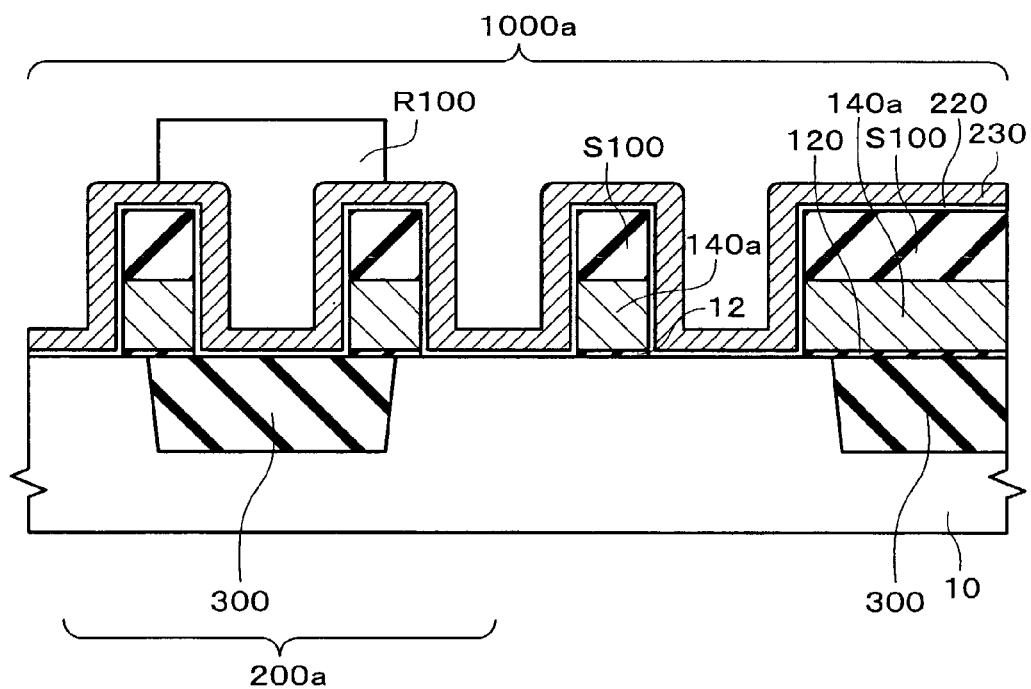
FIG. 8 is a cross-sectional view showing another step of the method of manufacturing the semiconductor device shown in FIGS. 1 to 3.

(4) As shown in FIG. 8, a doped polysilicon layer (second conductive layer) 230 is formed over the entire surface of the ONO film 220 in the memory cell array formation region 1000a. The conductive layer 40 which makes up the first the second control gates 20 and 30 (see FIG. 1), and the contact conductive layer 232 and the conductive layers 236 and 238 which make up the common contact section 200 (see FIG. 3) are formed from the doped polysilicon layer 230 by patterning and etching steps.

A resist layer R100 is formed in a region 200a in which the common contact section is formed (hereinafter called "common contact section formation region"). In the present embodiment, the resist layer R100 is provided in the common contact section formation region 200a at a position approximately corresponding to a region in which the contact conductive layer 232 is formed in a subsequent step, as shown in FIG. 8. Specifically, the resist layer R100 is formed at least in the region in which the contact conductive layer 232 is formed in a subsequent step.

Figure 9:
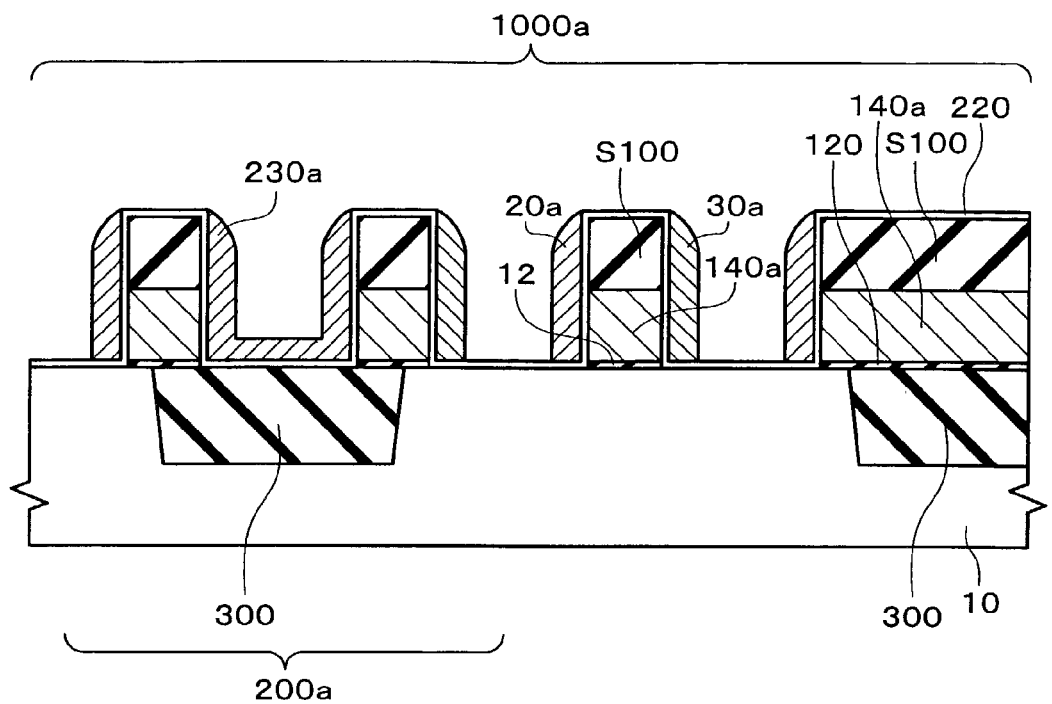
FIG. 9 is a cross-sectional view showing another step of the method of manufacturing the semiconductor device shown in FIGS. 1 to 3.

(5) As shown in FIG. 9, the entire surface of the doped polysilicon layer 230 (see FIG. 8) is anisotropically etched by using the resist layer R100 as a mask, whereby first and second control gates 20a and 30a and a conductive layer 230a are formed. The conductive layer 230a is formed in the common contact section formation region 200a.

Specifically, the first and second control gates 20a and 30a in the shape of sidewalls are formed by this etching step along the sides of the exposed openings 160 and 180 (see FIG. 6). The conductive layer 230a is formed during this step in the area masked by the resist layer R100. The insulating layer deposited in the region in which the silicide layer is formed in a subsequent step is removed by this etching, whereby the semiconductor substrate 10 is exposed. The resist layer R100 is then removed.

Figure 10:
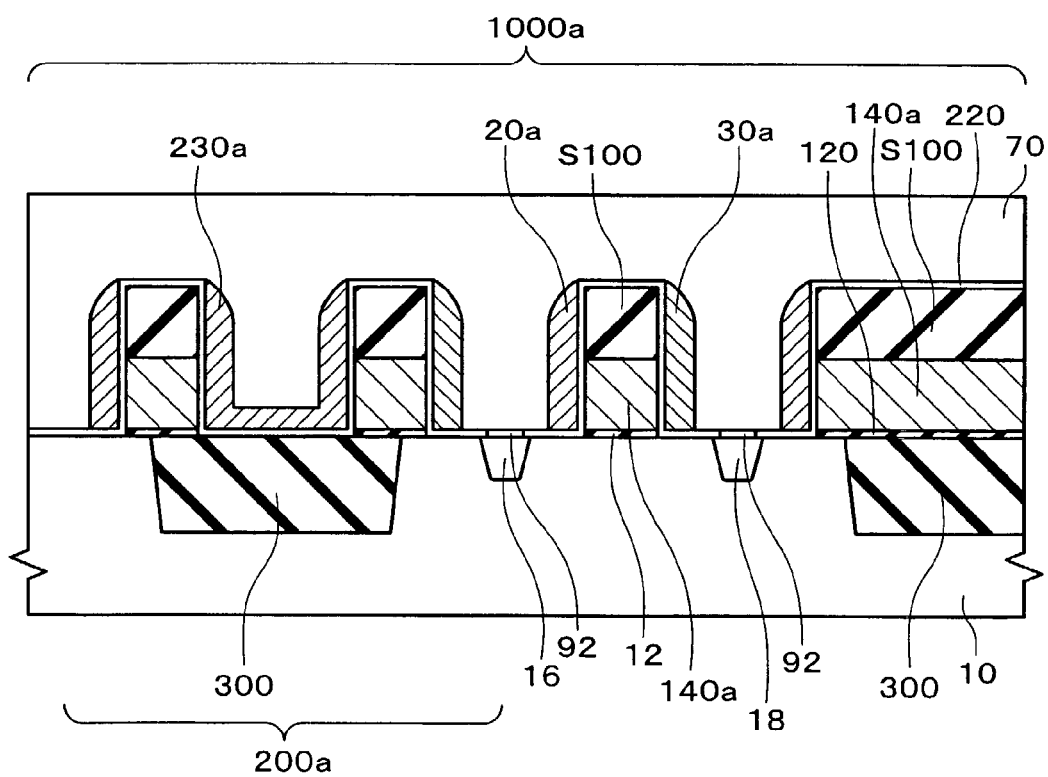
FIG. 10 is a cross-sectional view showing another step of the method of manufacturing the semiconductor device shown in FIGS. 1 to 3.

(6) As shown in FIG. 10, the impurity layers 16 and 18 which make up either a source region or a drain region are formed in the semiconductor substrate 10 by ion implantation with N-type impurities.

A metal for forming a silicide is deposited over the entire surface. As examples of a metal for forming a silicide, titanium, cobalt, and the like can be given. The metal formed on the impurity layers 16 and 18 is subjected to a silicidation reaction, whereby silicide layers 92 are formed on the upper sides of the impurity layers 16 and 18. Therefore, the surfaces of the source/drain regions of the memory cells 100 are self-alignably silicided by this silicidation step.

As shown in FIG. 10, the insulating layer (second insulating layer) 70 such as silicon oxide or silicon nitride oxide is formed over the entire surface of the memory cell array formation region 1000a. The insulating layer 70 is formed so that the stopper layer S100 is covered with the insulating layer 70 and openings between the first and second control gates 20a and 30a and the conductive layer 230a are filled with the insulating layer 70.

Figure 11:
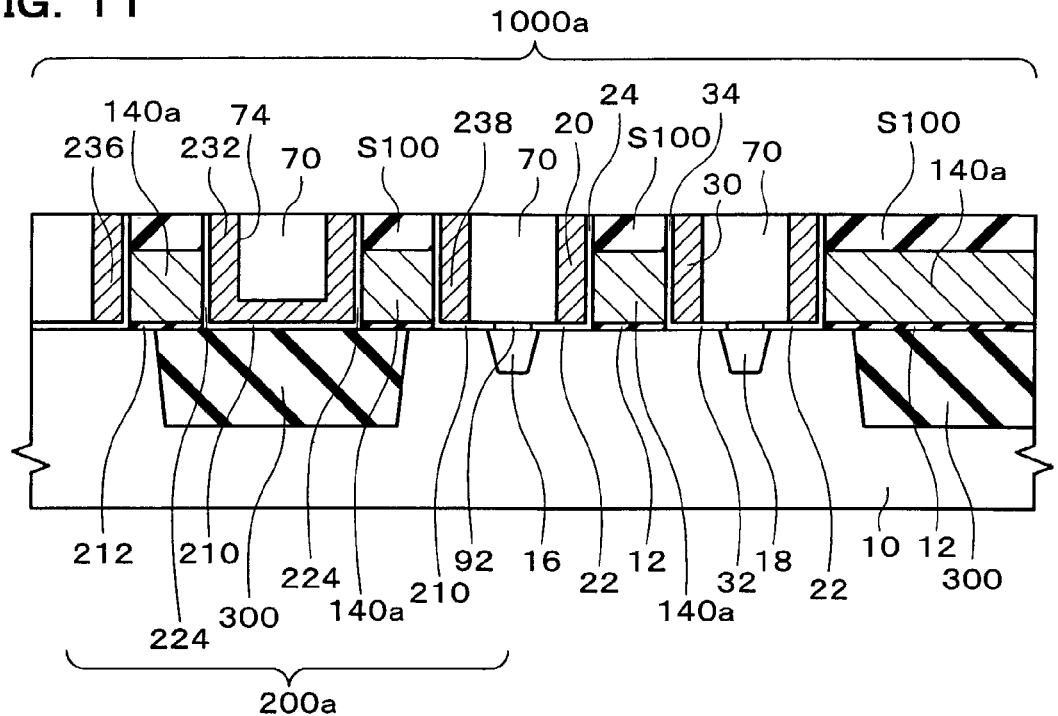
FIG. 11 is a cross-sectional view showing another step of the method of manufacturing the semiconductor device shown in FIGS. 1 to 3.

(7) As shown in FIG. 11, the insulating layer 70 is polished by using the CMP method so that the stopper layer S100 are exposed, whereby the insulating layer 70 is planarized. Each of the first and second control gates 20 and 30 having a rectangular cross-sectional shape is formed by this polishing. The upper part of the conductive layer 230a is removed by this step, whereby the contact conductive layer 232 and the conductive layers 236 and 238 are formed in the common contact section formation region 200a. The second insulating layer 70 remaining between the two first side insulating layers 24 facing each other with the first and second control gates 20 and 30 interposed therebetween becomes the embedding insulating layer 70.

The upper ends of the first side insulating layers 24 and 34 formed on the sides of the gate layer 140a and the stopper layer S100 are located at a position higher than the upper ends of the first and second control gates 20 and 30 with respect to the semiconductor substrate 10.

The first and second control gates 20 and 30 are completely covered with the embedding insulating layer 70. The upper side of the contact conductive layer 232 is exposed in the common contact section formation region 200a. The depression 74 formed by the contact conductive layer 232 is filled with the embedding insulating layer 70.

Figure 12:
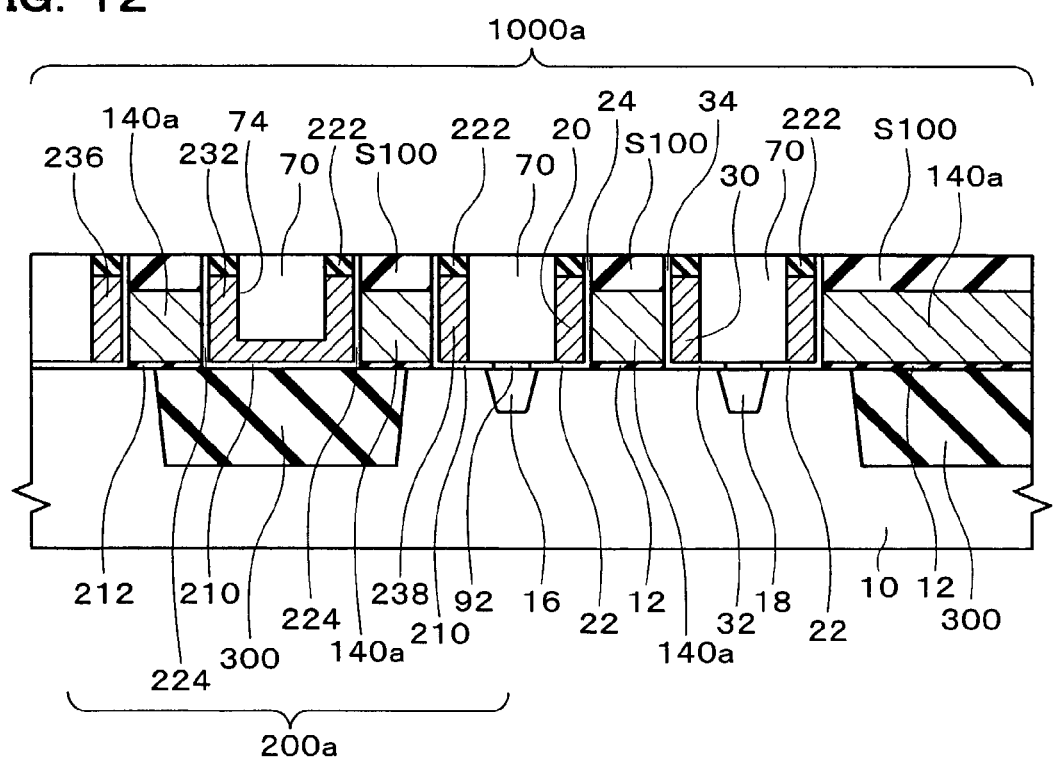
FIG. 12 is a cross-sectional view showing another step of the method of manufacturing the semiconductor device shown in FIGS. 1 to 3.

(8) As shown in FIG. 12, the third insulating layer 222 is formed on the first and second control gates 20 and 30, the contact conductive layer 232, and the conductive layers 236 and 238. The third insulating layer 222 may be formed by etching the upper part of the first and second control gates 20 and 30, the contact conductive layer 232, and the conductive layers 236 and 238, providing a silicon oxide layer, for example, and planarizing the layers by using the CMP method.

The third insulating layer 222 may be formed by oxidizing the upper part of the first and second control gates 20 and 30, the contact conductive layer 232, and the conductive layers 236 and 238 by thermal oxidation or the like. In this case, after oxidizing the upper part of the first and second control gates 20 and 30, the contact conductive layer 232, and the conductive layers 236 and 238, these layers are optionally planarized by using the CMP method.

Figure 13:
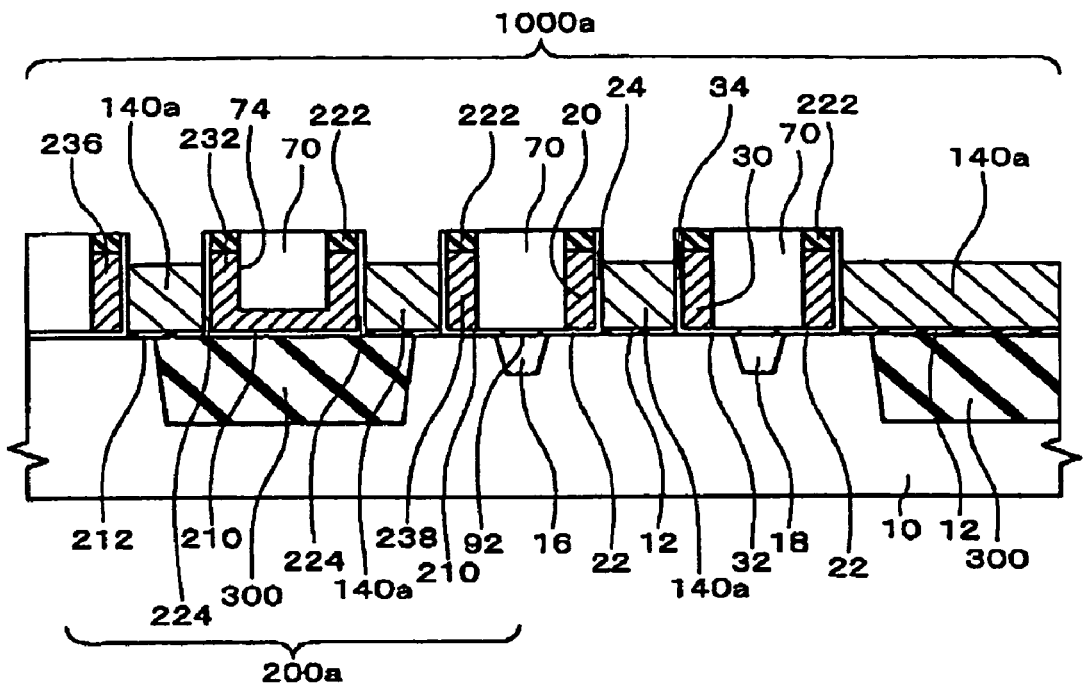
FIG. 13 is a cross-sectional view showing another step of the method of manufacturing the semiconductor device shown in FIGS. 1 to 3.
Figure 14:
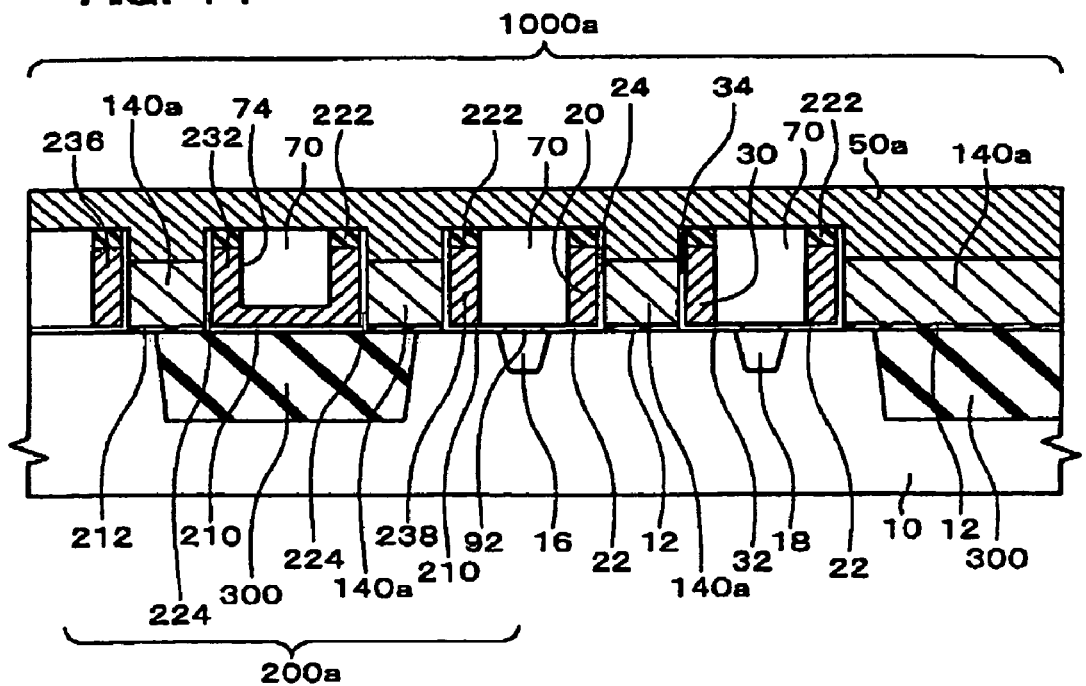
FIG. 14 is a cross-sectional view showing another step of the method of manufacturing the semiconductor device shown in FIGS. 1 to 3.
Figure 15:
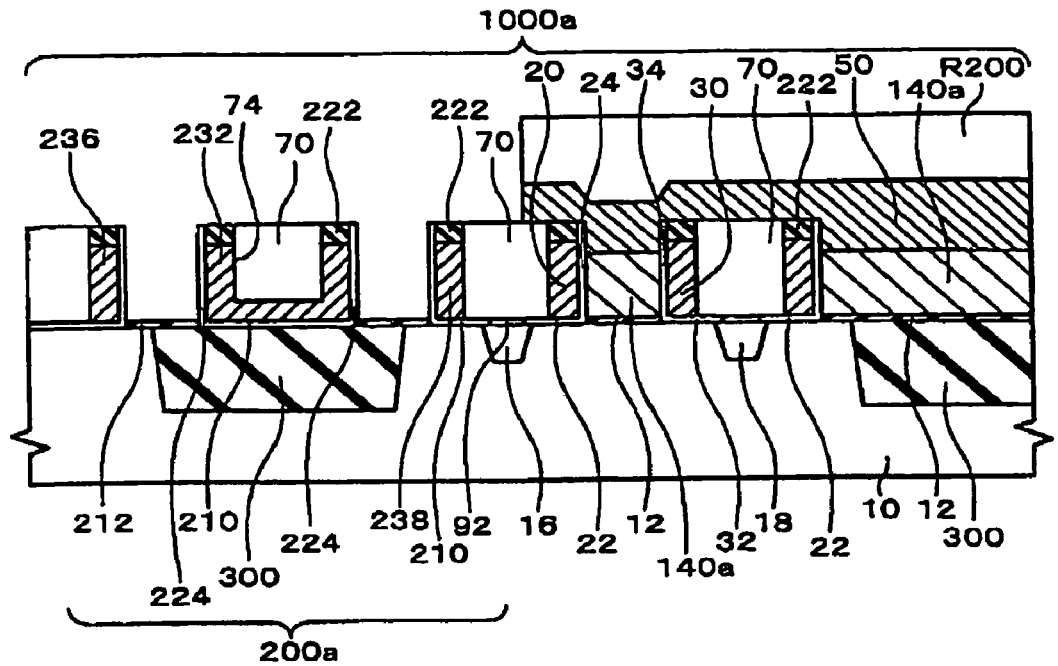
FIG. 15 is a cross-sectional view showing yet another step of the method of manufacturing the semiconductor device shown in FIGS. 1 to 3.

(9) The stopper layer S100 is removed by using thermal phosphoric acid. As a result, at least the upper side of the gate layer 140a is exposed, as shown in FIG. 13. After forming a third conductive layer (not shown) over the entire surface of the memory cell array formation region 1000a, a patterned resist layer R200 is formed on the third conductive layer, as shown in FIG. 14. The third conductive layer is patterned by using the resist layer R200 as a mask. The word line 50 is formed on the gate layer 140a by this patterning. As the third conductive layer, a doped polysilicon layer or the like may be used. The gate layer 140a (see FIG. 15) formed of doped polysilicon is patterned by using the resist layer R200 as a mask, thereby forming the word gates 14 arranged in an array (see FIG. 2). The region in which the gate layer 140a is removed corresponds to the formation region of the P-type impurity layer (element isolation impurity layer) 15 which is formed later (see FIG. 2). The gate layer 140a in the common contact section formation region 200a is removed by this step, as shown in FIG. 15. The resist layer R200 is then removed.

In this etching step, since the first and second control gates 20 and 30, the contact conductive layer 232, and the conductive layers 236 and 238 are covered with the insulating layer 70, the first and second control gates 20 and 30, the contact conductive layer 232, and the conductive layers 236 and 238 are allowed to remain without being etched.

The entire surface of the semiconductor substrate 10 is doped with P-type impurities. This causes the P-type impurity layers (element isolation impurity layers) 15 (see FIG. 2) to be formed in regions between the word gates 14 in the Y direction. The conductivity type of the element isolation impurity layers 15 is opposite to the conductivity type of the nonvolatile memory device. The elements of the memory cells 100 can be isolated from one another more reliably by the P-type impurity layers 15.

Figure 16:
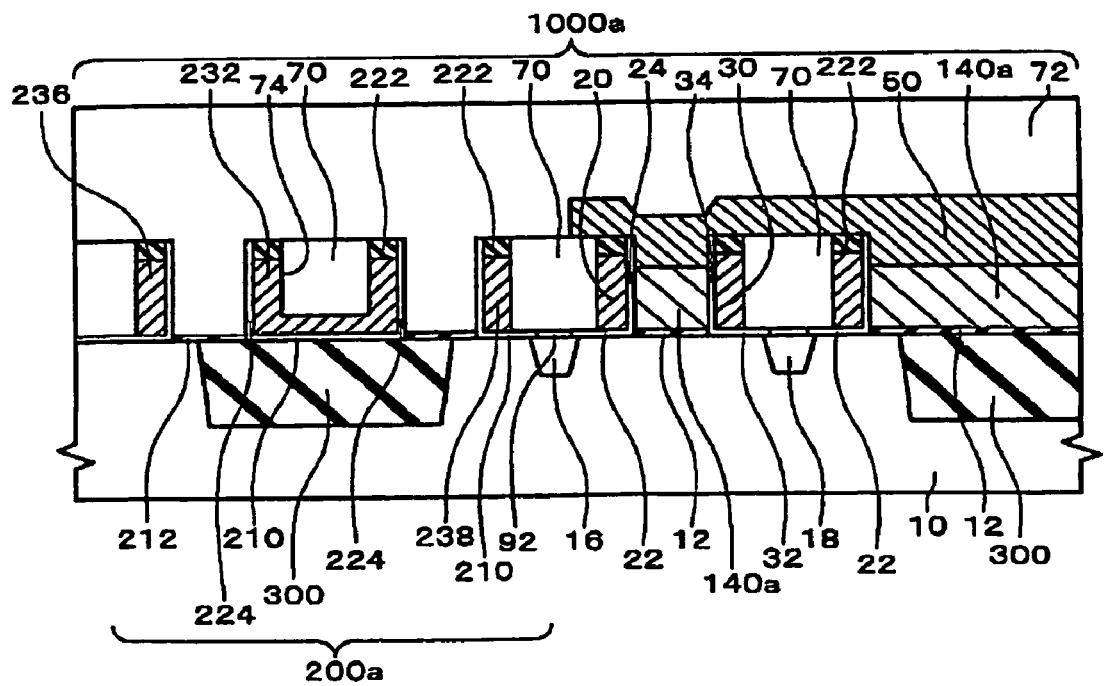
FIG. 16 is a cross-sectional view showing another step of the method of manufacturing the semiconductor device shown in FIGS. 1 to 3.
Figure 17:
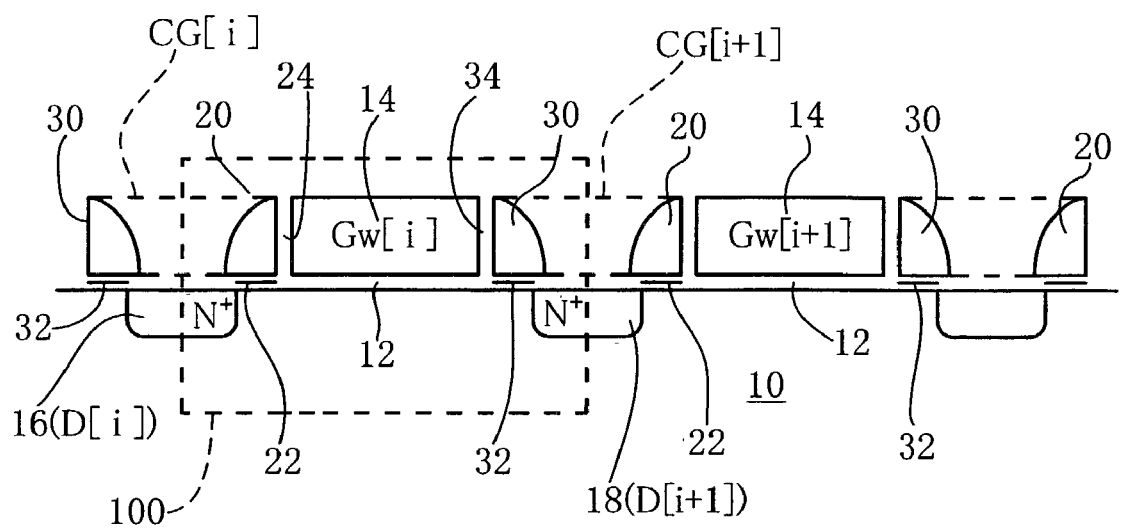
FIG. 17 is a cross-sectional view showing a conventional MONOS memory cell.

(10) The interlayer dielectric 72 is stacked as shown in FIG. 16. After forming the contact hole 84 in the interlayer dielectric 72, the plug conductive layer 82 connected with the common contact section 200 and the interconnect layer 80 are formed (see FIG. 3).

The third insulating layer 222 remains at least on part of the upper side of the contact conductive layer 232 depending upon the diameter of the contact hole 84, as shown in FIG. 3.

The semiconductor device shown in FIGS. 1 to 3 is manufactured by these steps.

According to the method of manufacturing the semiconductor device of the present embodiment, the common contact section 200 can be formed together with the first and second control gates 20 and 30 in the shape of sidewalls. Since the common contact section 200 has a size close to at least the widths of the impurity layers 16 and 18, a sufficiently large contact area can be secured. Therefore, according to the present embodiment, reliable electrical connection with the control gates 20 and 30 can be secured through the common contact section 200, even if the control gates 20 and 30 are in the shape of sidewalls for which it is difficult to provide a sufficient contact area.

According to the method of manufacturing the semiconductor device of the present embodiment, the first and second control gates 20 and 30 are formed so that the cross-sectional shape of each of the first and second control gates 20 and 30 is rectangular. Because of this, the amount of etching of the doped polysilicon layer 230 can be decreased in the step of forming the conductive layer 230a by etching the doped polysilicon layer 230 (see FIG. 9).

The embodiment of the present invention is described above. However, the present invention is not limited thereto. Various modifications and variations are possible within the scope of the present invention. For example, a bulk semiconductor substrate is used as the semiconductor layer in the above embodiment. However, a semiconductor layer of an SOI substrate may be used.

What is claimed is:

1. A semiconductor device including a memory cell array in which nonvolatile memory devices are arranged in a matrix of a plurality of rows and columns,
wherein each of the nonvolatile memory devices comprises:
a word gate which is formed over a semiconductor layer with a first gate insulating layer interposed therebetween;
an impurity layer which is formed in the semiconductor layer and forms at least one of a source region and a drain region; and
first and second control gates in the shape of sidewalls which are formed along two opposing sides of the word gate, respectively,
wherein the first control gate is disposed over the semiconductor layer with a second gate insulating layer interposed therebetween, a first side insulating layer being interposed between the first control gate and the word gate,
wherein the second control gate is disposed over the semiconductor layer with a second gate insulating layer interposed therebetween, a first side insulating layer being interposed between the first control gate and the word gate,
wherein each of the first and second control gates extends in a first direction,
wherein the first and second control gates are disposed so as to be adjacent to each other in a second direction, which intersects the first direction, with the impurity layer interposed therebetween,
wherein each of the first and second control gates has one of rectangular and square cross-sectional shapes in a plane perpendicular to said semiconductor layer, and
wherein each of the second gate insulating layer and the first side insulating layer is formed of a stacked film including a first silicon oxide layer, a silicon nitride layer, and a second silicon oxide layer.

2. A semiconductor device including a memory cell array in which nonvolatile memory devices are arranged in a matrix of a plurality of rows and columns,
wherein each of the nonvolatile memory devices comprises:
a word gate which is formed over a semiconductor layer with a first gate insulating layer interposed therebetween;
an impurity layer which is formed in the semiconductor layer and forms at least one of a source region and a drain region; and
first and second control gates in the shape of sidewalls which are formed along two opposing sides of the word gate, respectively,
wherein the first control gate is disposed over the semiconductor layer with a second gate insulating layer interposed therebetween, a first side insulating layer being interposed between the first control gate and the word gate,
wherein the second control gate is disposed over the semiconductor layer with a second gate insulating layer interposed therebetween, a first side insulating layer being interposed between the first control gate and the word gate,
wherein each of the first and second control gates extends in a first direction,
wherein the first and second control gates adjacent to each other in a second direction, which intersects the first direction, with the impurity layer interposed therebetween, are connected with a common contact section,
wherein the common contact section includes a contact conductive layer, and
wherein the contact conductive layer is continuous with the first and second control gates.

3. The semiconductor device according to claim 2, wherein each of the first and second control gates has one of rectangular and square cross-sectional shapes.

4. The semiconductor device according to claim 2, wherein a third insulating layer is formed on the first and second control gates.

5. The semiconductor device according to claim 2, wherein a depression is formed by the contact conductive layer.

6. The semiconductor device according to claim 5, wherein an interlayer dielectric is further provided over the semiconductor layer,
wherein a contact hole is formed on the depression through the interlayer dielectric, and
wherein the contact hole is filled with a plug conductive layer.

7. The semiconductor device according to claim 2, wherein the contact conductive layer is formed of the same material as the first and second control gates.

8. The semiconductor device according to claim 2, wherein the contact conductive layer is disposed over the semiconductor layer with a contact insulating layer interposed therebetween, and
wherein the contact insulating layer is formed of the same material as the second gate insulating layer.

9. The semiconductor device according to claim 2, wherein a second side insulating layer is disposed along the contact conductive layer.

10. The semiconductor device according to claim 9, wherein the second side insulating layer is formed of the same material as the first side insulating layer.

11. The semiconductor device according to claim 2, wherein an upper end of the first side insulating layer is located higher than the first and second control gates.

12. The semiconductor device according to claim 2, wherein the first and second control gates adjacent each other are covered with an insulating layer.

13. The semiconductor device according to claim 2, wherein the common contact section is provided adjacent to an end of the impurity layer.

14. The semiconductor device according to claim 13, wherein a plurality of the impurity layers are arranged, and
wherein a plurality of the common contact sections are provided alternately on one ends and opposite ends of the impurity layers.

15. The semiconductor device according to claim 2, wherein each of the second gate insulating layer and the first side insulating layer is formed of a stacked film including a first silicon oxide layer, a silicon nitride layer, and a second silicon oxide layer.

* * * * *